United States Patent
Darson et al.

(10) Patent No.: US 10,924,687 B2
(45) Date of Patent: Feb. 16, 2021

(54) ADAPTIVE GENERATION OF A HIGH DYNAMIC RANGE IMAGE OF A SCENE, ON THE BASIS OF A PLURALITY OF IMAGES OBTAINED BY NON-DESTRUCTIVE READING OF AN IMAGE SENSOR

(71) Applicants: CENTRE NATIONAL DE LA RECHERCHE SCIENTIFIQUE, Paris (FR); SORBONNE UNIVERSITÉ, Paris (FR); Université Paris Diderot—Paris 7 DIDEROT VALORISATION, Paris (FR); ECOLE NORMALE SUPERIEURE DE PARIS, Paris (FR); UNIVERSITÉ DE BOURGOGNE, Dijon (FR)

(72) Inventors: David Darson, Vaux le Penil (FR); Julien Dubois, Quetigny (FR); Barthélémy Heyrman, Quetigny (FR); Dominique Ginhac, Thorey en Plaine (FR); Mustapha Bouderbane, Dijon (FR)

(73) Assignees: CENTRE NATIONAL DE LA RECHERCHE SCIENTIFIQUE, Paris (FR); SORBONNE UNIVERSITE, Paris (FR); UNIVERSITE PARIS DIDEROT—PARIS 7, Paris (FR); ECOLE NORMALE SUPERIEURE, Paris (FR); UNIVERSITE DE BOURGOGNE, Dijon (FR)

( * ) Notice: Subject to any disclaimer, the term of this patent is extended or adjusted under 35 U.S.C. 154(b) by 0 days.

(21) Appl. No.: 16/478,404

(22) PCT Filed: Dec. 22, 2017

(86) PCT No.: PCT/EP2017/084393
§ 371 (c)(1),
(2) Date: Jul. 16, 2019

(87) PCT Pub. No.: WO2018/134029
PCT Pub. Date: Jul. 26, 2018

(65) Prior Publication Data
US 2019/0379817 A1    Dec. 12, 2019

(30) Foreign Application Priority Data

Jan. 17, 2017 (FR) ...................................... 1750359

(51) Int. Cl.
*H04N 5/232* (2006.01)
*H04N 5/272* (2006.01)
(Continued)

(52) U.S. Cl.
CPC ..... *H04N 5/2355* (2013.01); *H01L 27/14609* (2013.01); *H04N 5/2353* (2013.01); *H04N 5/35581* (2013.01); *H04N 5/378* (2013.01)

(58) Field of Classification Search
None
See application file for complete search history.

(56) References Cited

U.S. PATENT DOCUMENTS 6,219,097 B1   4/2001   Kamishima et al.
7,860,938 B2   12/2010  Youn et al.
(Continued)

FOREIGN PATENT DOCUMENTS

| CN | 101072303 A | 11/2007 |
|---|---|---|
| CN | 101647119 A | 2/2010 |
| CN | 103248901 A | 8/2013 |

OTHER PUBLICATIONS

Samuel W Hasinoff et al: "Noise-optimal capture for high dynamic range photography", 2010 IEEE Conference on Computer Vision and Pattern Recognition (CVPR), Jun. 13-18, 2010, San Francisco, CA, USA, IEEE, Piscataway, NJ, USA, Jun. 13, 2010 (Jun. 13, 2010), pp. 553-560, XP031725992, ISBN: 978-1-4244.
(Continued)

*Primary Examiner* — Mark T Monk
(74) *Attorney, Agent, or Firm* — Nixon & Vanderhye

(57) ABSTRACT

High dynamic range (HDR) images are generated on the basis of a plurality of images obtained by non-destructive reading of an image sensor, called NDRO images. An HDR image generation method includes: the determination of a criterion of desired quality for the HDR image; at least two
(Continued)

Figure 1:
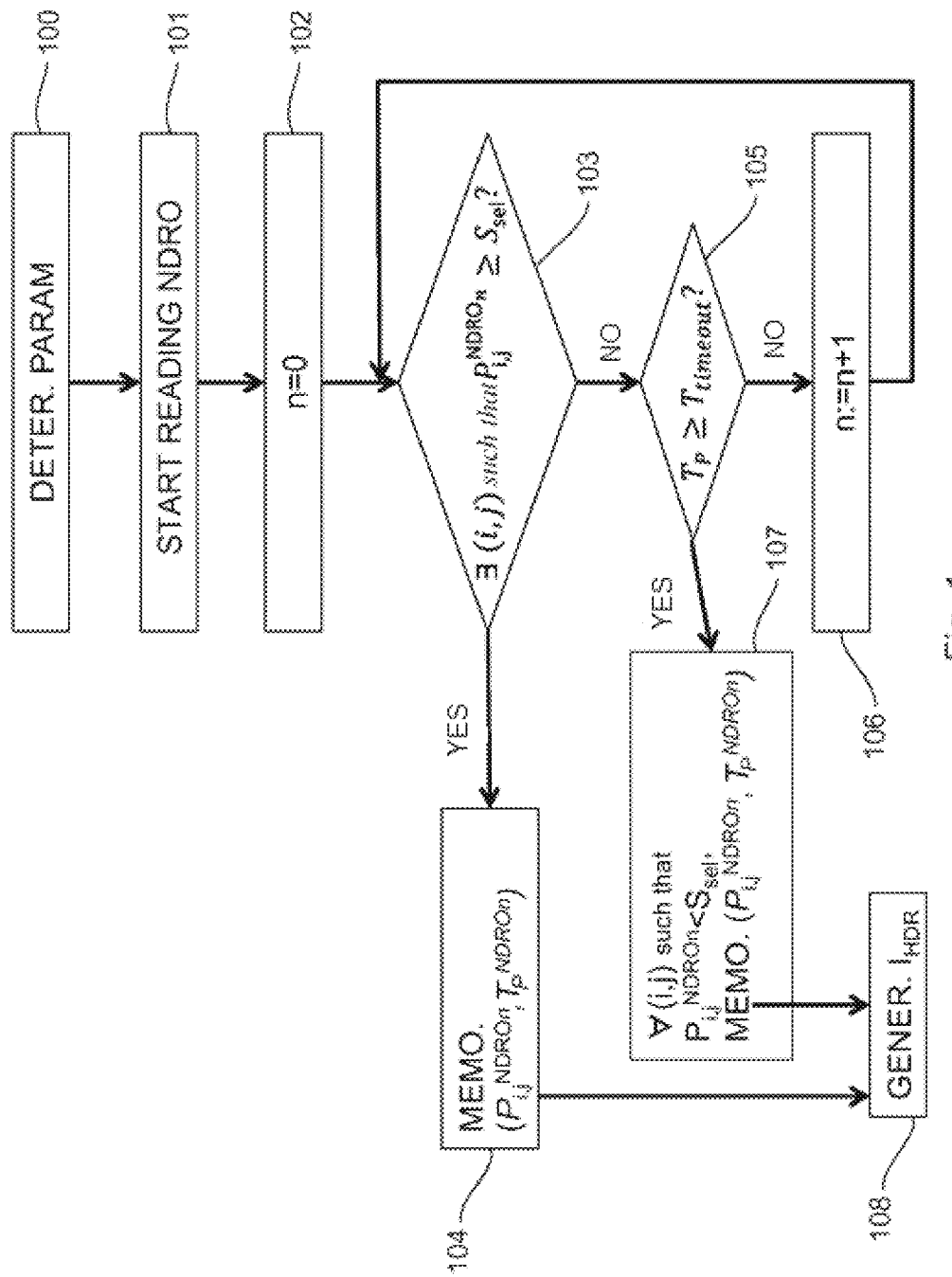

non-destructive readings of the sensor delivering at least two successive NDRO images; the selection, as a function of the criterion of desired quality, of the first and of the last NDRO image to be used to generate the HDR image; the generation of the HDR image on the basis of information extracted from a series of successive NDRO images starting with the first and terminating with the last NDRO image to be used; the storage of a single image at one and the same time throughout the entire HDR generation phase.

20 Claims, 3 Drawing Sheets

(51) Int. Cl.
    *H04N 5/355*     (2011.01)
    *H01L 27/146*     (2006.01)
    *H04N 5/235*     (2006.01)
    *H04N 5/378*     (2011.01)

(56) References Cited

U.S. PATENT DOCUMENTS

| | | |
|---|---|---|
| 2007/0268396 A1 | 11/2007 | Kurane |
| 2014/0320716 A1* | 10/2014 | Huang .................. H04N 5/378 348/302 |
| 2015/0110248 A1* | 4/2015 | Rabi ..................... G01T 1/2018 378/62 |
| 2015/0130967 A1 | 5/2015 | Pieper |
| 2015/0264273 A1* | 9/2015 | Feder .................. H04N 5/2256 348/239 |

OTHER PUBLICATIONS

International Search Report dated Feb. 22, 2018, in corresponding PCT/EP2017/084393.

* cited by examiner

ADAPTIVE GENERATION OF A HIGH DYNAMIC RANGE IMAGE OF A SCENE, ON THE BASIS OF A PLURALITY OF IMAGES OBTAINED BY NON-DESTRUCTIVE READING OF AN IMAGE SENSOR

1. FIELD OF THE INVENTION

The field of the invention is that of the acquisition of images using capture devices such as digital cameras (DC), cameras, microscopes, smartphones equipped with DCs, etc. More specifically, the invention relates to a method for acquiring high dynamic range (HDR) images.

It is applicable in particular, but not exclusively, in the fields of cinema, video surveillance, air or road transport, non-destructive inspection, the medical field, or the fundamental sciences such as physics, astronomy, etc.

2. PRIOR ART AND ITS DRAWBACKS

The performance of the existing image capture devices is often limited by the narrowness of their dynamic range. Thus, when a scene to be captured, in still image or video form, has strong contrasts, the image retrieved by the capture device can have overexposed areas, in which the pixels of the image are saturated, corresponding to very bright areas of the scene, and dark areas, details that are only slightly or not at all visible, corresponding to poorly lit areas of the scene.

To resolve this problem, and to generate, from existing capture devices, high dynamic range images, called HDR images, it has been considered to combine several conventional images, called LDR (low dynamic range) images, associated with different exposure times. Thus, the scene to be imaged is photographed several times, by the same capture device, with different exposure times: the short exposure times make it possible not to saturate the very bright areas of the image, and the long exposure times make it possible to detect a useful signal in the less bright areas. The different LDR images obtained are next processed to extract the parts of the image having the best rendering from each one, and these different parts are combined to construct an HDR image of the scene.

This HDR image generation method is costly in terms of time and number of exposures to be done. As a result, it is in particular not suitable for generating an HDR video sequence, due to its non-real time nature.

Furthermore, when the scene to be imaged comprises moving elements, they may be in different positions in the different captured LDR images, which can cause artifacts to appear during the generation of the HDR image. These ghost effects can be corrected before the reconstruction of the HDR image, but at the expense of complex and costly processing electronics. An algorithm for eliminating such artifacts is for example described by Mustapha Bouderbane et al. in the article "*Suppression de l'artéfact de ghost pour la génération de vidéo HDR temps-réel*", Compas '2016: Parallélisme/Architecture/Système, Lorient, France, Jul. 5 to 8, 2016.

The evolution of the detectors on board these image capture devices now allows the latter to operate in Non-Destructive Read Out (NDRO) mode. In this operating mode, the electric charges accumulated by the photoelectric conversion elements of the detector can be read, without reset: it is thus possible, during the exposure time of the sensor, to perform several readouts of the pixel signals, while allowing the electric charges to continue to accumulate, under the effect of the exposure of the sensor to the light.

The use of this non-destructive readout mode, which allows several readouts of the signals associated with the pixels of the sensor during a single exposure time, offers an interesting solution both to the time cost problem of the earlier HDR image generating methods and to that of the appearance of artifacts. It is in fact possible to generate a high dynamic range image of a scene from several images obtained by non-destructive readout of the sensor during a same exposure time.

Thus, patent document U.S. Pat. No. 7,860,938 proposes a new type of image capture device, in which a first reader performs a first readout of charges accumulated by the photoelectric conversion elements of the sensor in destructive readout mode, with resetting of the signals of the pixels after each readout, after a standard exposure time, and a second reader operates in non-destructive readout mode, to obtain several NDRO images associated with different short exposure times, i.e., shorter than the standard exposure time. The different NDRO images associated with short exposure times are used to predict whether certain pixels of the image obtained by the first reader will be saturated, due to an overexposure of the corresponding parts of the scene to be imaged during the standard exposure time. If so, an HDR image is generated in which the saturated pixels of the image obtained by the first reader in the standard exposure time are replaced by the corresponding non-saturated pixels extracted from an NDRO image associated with a shorter exposure time.

Although it is interesting in that it makes it possible, relative to the earlier techniques, to reduce the time necessary to generate a high dynamic range image, this method nevertheless still has several drawbacks, including a high computing power need, related to the multiple successive non-destructive readouts of the sensor that are required.

Furthermore, this technique, which provides an interesting solution to the issue of the saturation of certain areas of the image, does not make it possible to resolve the problem of the weakly exposed areas. Indeed, according to this technique, the pixels of the image saturated via a conventional exposure are "desaturated", since they are replaced by the same pixels from NDRO readouts with shorter equivalent exposure times; conversely, this technique does not make it possible to adapt to the weak signals, which are set by the accumulation related to the conventional exposure.

There is therefore a need for a technique for generating a high dynamic range image not having these various drawbacks of the prior art. In particular, there is a need for such a technique that is less costly, both in terms of time and computing power. There is also a need for such a technique for generating an HDR image that is adaptive, and that can automatically adjust the number of NDRO readouts required in terms of the brightness of the scene to be rendered in an HDR image, based on the targeted final image quality, and the desired final dynamic both for strong signals and weak signals.

3. BRIEF DESCRIPTION OF THE INVENTION

The invention meets this need by proposing a method for generating a high dynamic range image of a scene, from a plurality of images of the scene obtained by non-destructive readout of an image sensor, called NDRO images. The sensor comprises a plurality of pixels arranged in matrix form, and each associated with a photoelectric conversion element making it possible to convert a received light into electric charges and to accumulate the electric charges during an exposure time to the light.

According to the invention, such a method comprises:
- a first non-destructive readout of said image sensor, delivering a first current NDRO image with index n=0, and storing of said first image, within a memory zone, in association with an exposure time associated with said first image;
- for each pixel of said first image, a comparison of a signal value corresponding to said electric charges accumulated by said pixel with a signal selection threshold, and a selection of said pixel if said signal value associated with said pixel is above said signal selection threshold;
- at least one iteration of the following successive steps, for integer n, n varying from 1 to N:
  - a non-destructive readout of said image sensor, delivering a current NDRO image with index n;
  - an update of said memory zone by storing, for each pixel of said current NDRO image with index n not previously selected in an NDRO image preceding said current NDRO image, a signal value associated with said pixel, in combination with an exposure time associated with said current NDRO image with index n;
  - for each pixel of said current NDRO image with index n, comparing a signal value corresponding to said electric charges accumulated by said pixel with said signal selection threshold, and selecting said pixel if said signal value associated with said pixel is above said signal selection threshold;
- generating said high dynamic range image from said signal values associated with said selected pixels and said exposure times stored in association.

Thus, the invention is based on a fully novel and inventive approach to generating HDR images from a plurality of so-called NDRO images, i.e., obtained by non-destructive readout of the pixels of the sensor. Such a method is adaptive, in that it makes it possible to optimize the number of non-destructive readouts to be done, as well as their associated exposure times, in light of the characteristics of the scene to be imaged.

Indeed, the inventive method, according to one embodiment, proposes to proceed with several iterations of a readout of the sensor in non-destructive readout mode, and to dynamically optimize the number of readouts necessary for the HDR reconstruction, by determining, based on a targeted quality criterion of the final HDR image, what the first NDRO image is in which one or several pixels satisfy the quality criteria that are determined for the HDR image. These pixels are selected and stored in a unique memory area, making up an image of the sensor. For each successive NDRO image, new pixels are selected satisfying the quality criteria determined for the HDR image, if they exist, and the memory area is updated accordingly. The values of the pixels previously selected and stored in the preceding NDRO images in turn remain frozen, and are not updated. One thus gradually builds an image of the sensor storing, in association, the values of the pixels satisfying the desired quality criteria, in association with the exposure times of the NDRO images from which they are extracted.

More specifically, a selection threshold $S_{sel}$ is defined such that $S_0 \leq S_{sel} \leq S_{sat}$, where $S_0$ is the signal corresponding to the weakest usable electronic signal coming from the detector (typically, the signal whose level corresponds to the readout noise from the detector or more generally the imaging system), and where $S_{sat}$ is the saturation signal of the sensor (imposed by the first saturated element in the detector: pixel, charge conversion and/or amplification chain, etc.). This signal selection threshold is defined before the beginning of the acquisition of the NDRO images, and can be modified for each new sequence of NDRO images with a view to an HDR reconstruction. Thus, it can be modified to best adapt to the illumination conditions of the scene (and therefore the dynamic to be imaged), or to optimize the exposure time or the final SNR of the weakest signals, for example.

Once the signal value of a pixel reaches this selection threshold, this pixel is selected for the reconstruction of the HDR image, and stored, in association with the exposure time of the NDRO image from which it is extracted. The first selected pixel defines, as a result, the first NDRO image to be used for the reconstruction of the HDR image.

One thus adjusts, on the fly, the number of non-destructive readouts to be done to reach the targeted quality level of the HDR image, in particular based on brightness levels of the scene to be imaged.

This dynamic adjustment of the number of non-destructive readouts necessary is done for each HDR image, such that the number of exposures and the associated exposure times can be optimized based on different brightness levels encountered in the scene to be imaged.

Furthermore, such an HDR image generating method is based on the use of a single memory area, corresponding to an image of the sensor, and does not require storing all of the successive images obtained by non-destructive readouts from the image sensor, which makes it possible to save considerable space relative to the techniques of the prior art, both in terms of required storage space and bandwidth between the storage space and the processing unit, and the computing power necessary to generate the HDR image.

Furthermore, this on-the-fly generation with single storage space makes it possible, in a real-time usage mode, to extend the number of images, this number thus being adapted to be increased without physical limitation and therefore potentially the imaged dynamic. Owing to such a method, a single image plane is kept in memory, with gradual updating of the pixels weighted by their associated exposure time, over the course of successive NDRO readouts.

Thus, a depiction of the matrix of the sensor is stored in a memory area, and is re-updated upon each new acquired NDRO image. Each element of this memory area stores the current value of each of the pixels of the last read NDRO image, or, if this value has reached the signal selection threshold in a preceding NDRO image, the corresponding value in this preceding image, which will be used for the reconstruction of the HDR image. These values are stored in association with the exposure times of the NDRO images from which they are extracted.

According to one advantageous aspect of the invention, the steps of the method necessary to generate said high dynamic range image implement a storage of a single image at a given moment. Thus, in the memory area, only one image is stored at each moment of the generation phase of the high dynamic range image.

According to one aspect of the invention, such a method comprises a preliminary step for determining a desired quality criterion for said high dynamic range image and a maximum exposure time for said sensor. Such a maximum exposure time of the sensor makes it possible to limit the end time of the iterative process for generating the HDR image.

According to one embodiment of the invention, the desired quality criterion is a signal-to-noise ratio of the pixels of the high dynamic range image.

Thus, such a method for generating an HDR image is based on an optimization of the SNR (Signal-to-Noise Ratio), defined according to the equation (Eq. 9) below, on a level set in advance and an acquisition time of the HDR image that is as short as possible. The SNR is optimized at each NDRO and pixels selected according to this criterion. Thus, the final SNR will be optimized for each pixel selected at each of their respective NDROs and in particular for the weakest signals that have been selected and will have led to the last NDRO (as long as the desired SNR has been reached for the pixels with the weakest signals before the timeout $t_{out}$, also set in advance).

According to another aspect of this embodiment, the NDRO image with index N, i.e., the last NDRO image to be used to generate an HDR image, is:
- the first of said successive NDRO images in which all of the pixels are associated with a signal value greater than or equal to said signal selection threshold; or
- the last of said successive NDRO images, associated with said maximum exposure time of said sensor, if it contains at least one pixel associated with a signal value below said signal selection threshold.

Thus, once all of the pixels of the image have reached a value greater than or equal to the signal selection threshold, one stops the non-destructive readouts of the sensor, in order to reconstruct the HDR image. Conversely, if, at the end of a maximum exposure time chosen beforehand, pixels still exist whose value remains below this signal selection threshold, one nevertheless interrupts the non-destructive readouts of the sensor, to prevent the exposure time from being too great, or from drifting toward an infinite value, when the illumination conditions of the scene do not make it possible to reach this threshold. For these pixels, the value selected during the reconstruction of the HDR image corresponds to the signal value in the last read NDRO image.

According to another aspect of this embodiment, the generation of the high dynamic range image comprises a calculation of a signal value associated with each pixel of the high dynamic range image by evaluated weight, based on the response from the sensor, the signal value stored in said memory area for each of the pixels by the associated exposure time.

The reconstruction of the HDR image can be done gradually, over the course of different NDRO readings from the sensor, from values of each pixel selected as having a value above the signal selection threshold, weighted by the respective exposure times associated with the NDRO images from which they are extracted.

According to another aspect, such a method also comprises a prior determination of a minimum electric charge accumulation time on the image sensor before the first non-destructive readout of said image sensor, denoted $t_{min}$, and such a minimum accumulation time $t_{min}$ satisfies the condition:

$$\frac{t_{min} + (t_{NDRO})}{t_{min}} < \frac{S_{sat}}{S_0}$$

where:
$t_{NDRO}$ is a time between two successive non-destructive readout iterations of the image sensor;
$S_{sat}$ is a saturation signal of the image sensor;
$S_0$ is the weakest usable electronic signal coming from the image sensor.

This time $t_{min}$ therefore corresponds to the minimum accumulation time of the system. It is thus chosen so as to avoid any loss of information, while making sure, in the case where such a method is implemented in a system comprising a linear response sensor, that one remains within the linear operating range of the sensor.

While considering that $t_{min}$ corresponds to the accumulation time of the first NDRO image, and that all of the following NDRO readouts have an accumulation time increasing regularly by a pitch $t_{NDRO}$, the condition imposed on the accumulation time $t_{min}$ consists of making sure that the ratio of the accumulation times of the second NDRO image ($t_{min} + t_{NDRO}$) and the first NDRO image ($t_{min}$) is substantially the same as the dynamic of the linear response sensor.

The implementation of such a method in an acquisition system comprising a mixed linear/logarithmic response image sensor makes it possible to eliminate this constraint imposed on the minimum accumulation time $t_{min}$, which can then be reduced to a system clock tick.

The invention also relates to a computer program product comprising program code instructions for carrying out a method as previously described, when it is executed by a processor.

Such a program can use any programming language, and be in the form of source code, object code, or code partway between source code and object code, such as in a partially compiled form, or in any other desirable form.

The invention also relates to a recording medium readable by a computer on which a computer program is recorded comprising program code instructions for carrying out steps of the method for generating a high dynamic range image according to the invention as described above.

Such a recording medium can be any entity or device capable of storing the program. For example, the medium can include a storage means, such as a ROM, for example a CD-ROM or a microelectronic circuit ROM, or a magnetic recording means, for example a hard drive, or a flash memory, such as a USB key.

Furthermore, such a recording medium can be a transmissible medium such as an electric or optical signal, which can be conveyed via an electric or optical cable, by radio or by other means, such that the computer program that it contains is executable remotely. The program according to the invention can in particular be downloaded over a network, for example the Internet.

Alternatively, the recording medium can be an integrated circuit in which the program is incorporated, the circuit being suitable for executing or being used in the execution of the aforementioned display control method.

The invention also relates to a system for generating a high dynamic range image of a scene, from a plurality of images of the scene obtained by non-destructive readout of an image sensor, called NDRO images. Such a sensor comprises a plurality of pixels arranged in matrix form, and each associated with a photoelectric conversion element making it possible to convert a received light into electric charges and to accumulate the electric charges during an exposure time to the light. Such a system comprises a computing unit (processor, FPGA, etc.) suitable for carrying out steps of the method for generating a high dynamic range image as previously described.

The invention lastly relates to a system for generating a high dynamic range image of the scene, from a plurality of images of the scene obtained by non-destructive readout of an image sensor, called NDRO images. Such a system comprises a sensor comprising a plurality of pixels arranged in matrix form, and each associated with a photoelectric conversion element making it possible to convert a received light into electric charges and to accumulate the electric charges during an exposure time to the light, the sensor being adapted to operate in a non-destructive readout mode.

According to one embodiment of the invention, such a system comprises:
- an interface module for entry by a user of a desired quality criterion for the high dynamic range image and the maximum exposure time for said sensor;
- a computing unit (processor, FPGA, etc.) adapted to compare, for each pixel of an NDRO image, from among a plurality of successive NDRO images delivered by said sensor, a signal value corresponding to said electric charges accumulated by said pixel to a signal selection threshold, and to select said pixel if said signal value associated with said pixel is above said signal selection threshold and if said pixel has not been previously selected from a preceding NDRO image from said plurality of NDRO images;
- a memory adapted to store signal values associated with said selected pixels of said successive NDRO images in association with exposure times associated with said NDRO images;
- a computing unit (processor, FPGA, etc.) configured to generate said high dynamic range image from said signal values associated with said selected pixels and said exposure times stored in association.

More generally, such a system for generating a high dynamic range image comprises, in combination, all of the means necessary to implement the method for generating a high dynamic range image as previously described, according to all of its implementations and embodiments.

4. LIST OF FIGURES

Figure 2:
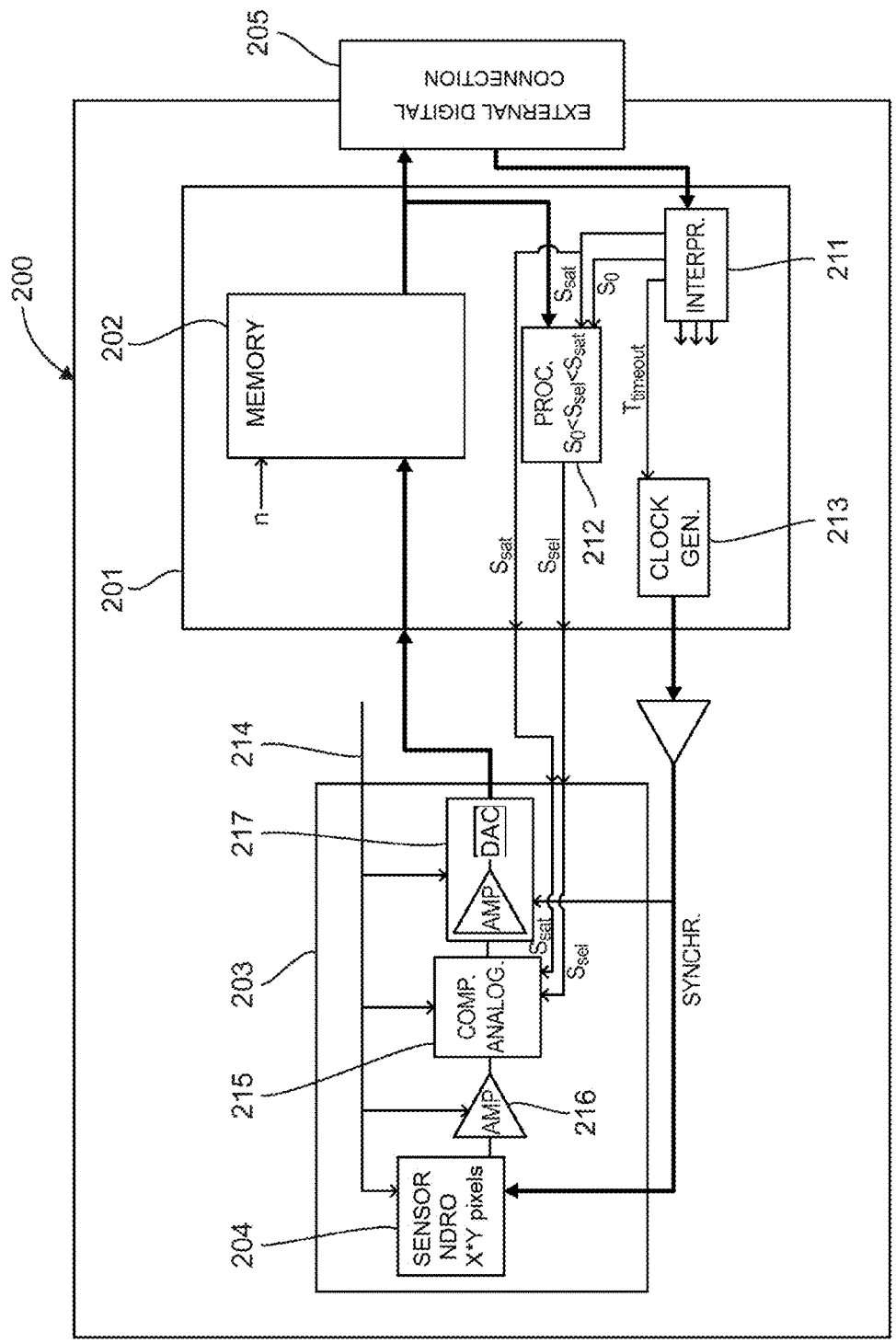
Figure 3:
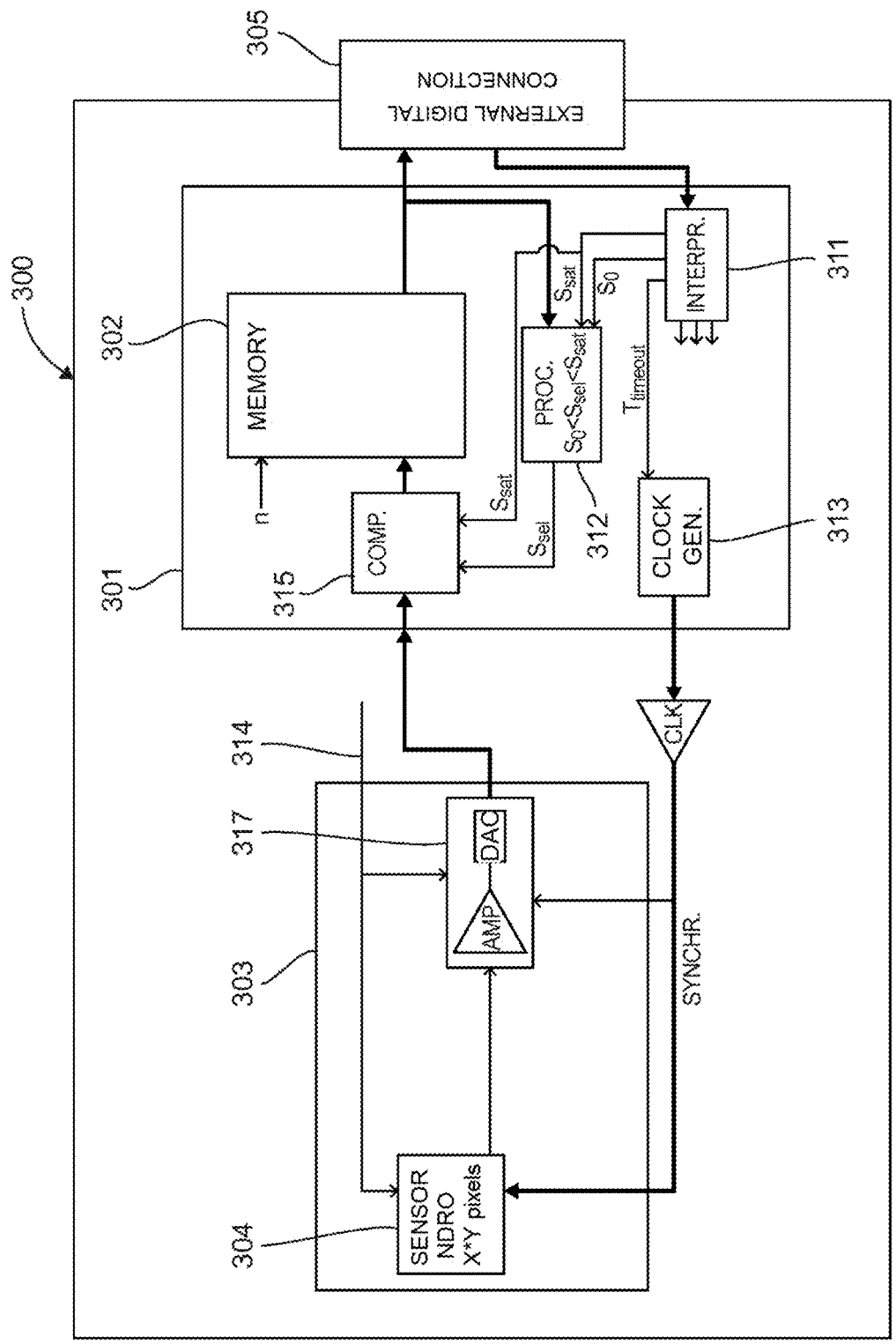

Other aims, features and advantages of the invention will appear more clearly upon reading the following description, provided as a simple illustrative and non-limiting example, in connection with figures, in which:

FIG. 1 is a flowchart illustrating one embodiment of an adaptive method for generating an HDR image from a plurality of NDRO images obtained by non-destructive readout in the image sensor;

FIGS. 2 and 3 propose two examples of hardware architecture of an HDR image generating system implementing the method illustrated in FIG. 1.

5. DETAILED DESCRIPTION OF THE INVENTION

The general principle of the invention is based on the reconstruction of high dynamic range (HDR) images from images obtained by non-destructive readouts of an image sensor, according to an adaptive method, making it possible to substantially improve the acquisition speed of the HDR image, and to dynamically improve the number of non-destructive readouts necessary, based on the dynamics of the targeted HDR image, and brightness parameters of the scene to be imaged.

5.1 Notations, Definitions and Principles

In the remainder of this document, the photoelectric conversion elements underlying the pixels of the sensor of the image acquisition system are made, for example, based on CMOS (Complementary Metal Oxide Semiconductor) technology. It will be recalled that CMOS technology equips most photographic or video systems. Image detectors of the CMOS type have the advantage of being adapted to be read in a so-called non-destructive readout (NDRO) mode.

The non-destructive readout mode makes it possible to read the electric charges accumulated by each of the photoelectric conversion elements of the sensor (therefore the signal values associated with the pixels), without resetting the latter. In other words, the NDRO readout makes it possible to observe the formation of an image on the detector during an exposure without destroying it.

"Saturation" refers to a state in which the quantity of incident light on the photoelectric conversion elements of the sensor exceeds the maximum quantity, in the linear operating range of the detector, of electric charges that these conversion elements can accumulate. This results in an overexposure phenomenon of the corresponding areas of the image, if one limits oneself to the linear range of the sensors. However, some sensors can use two responses, linear and logarithmic, at the same time, making it possible to lift this constraint, in particular in the choice of the accumulation time of the first NDRO.

Below, we propose several notations and definitions that will be used in the remainder of this document.

ADU: refers to an analog-digital unit, corresponding to the quantity of analog signal at the input of an analog-digital converter, so that it delivers a unit as output. Thus, by knowing the system gain (expressed in e-/ADU (electrons per ADU) for example), it is possible to determine the quantity of electrons from the detector, and by knowing the quantum efficiency, it is possible to determine the quantity of incident photons.

$Q_\lambda$: quantum efficiency of the system, defined as the ratio between the number of photons, at a given wavelength $\lambda$, having fallen on the sensor relative to the number of electric charges created by the photoelectric conversion elements of the sensor and usable as signal by the electronic readout system of the image acquisition system. The electric charges created by the photoelectric conversion elements of the detector, or sensor, from incident photons but next 'lost' in the overall readout noise are therefore deduced here.

$F_{max,\lambda}$: maximum incident luminous flux at a given wavelength $\lambda$, which can be expressed for example in photons per second.

$F_{min,\lambda}$: minimum incident luminous flux at a given wavelength $\lambda$, which can be expressed for example in photons per second.

$T_{timeout}$: Maximum exposure time of the sensor for an image, expressed in seconds. This maximum exposure time is determined before any image acquisition time, and can be adjustable for each new HDR image generation phase.

$n_{timeout}$: index of the $n^{th}$ NDRO image, associated with an exposure time equal to the maximum exposure time $T_{timeout}$.

$T_P$: exposure time for an HDR image to be generated, expressed in seconds, during which the non-destructive readouts of the sensor are done. The exposure time $T_P$ is less than or equal to the maximum exposure time $T_{timeout}$ and corresponds to the equivalent exposure time of the last NDRO image used for the reconstruction of the HDR image.

$t_{min}$: minimum accumulation time of the image acquisition system, corresponding to the minimum accumulation time until the first possible non-destructive readout of the sensor, expressed in seconds.

$t_{accu1}$: accumulation time until the first NDRO image useful for the HDR reconstruction. This time $t_{accu1}$ corresponds to the exposure time associated with the first of the successive NDRO images used for the reconstruction of the HDR image.

$t_{NDRO}$: readout time, expressed in seconds, of an NDRO image.

$S_{min}$: weakest signal on the final HDR image generated according to an embodiment of the present invention.

$s_{min}$: weakest signal due to the weakest incident flux on the different successive NDRO images obtained by non-destructive readout of the sensor of the image acquisition system.

$S_{max}$: strongest signal on the final HDR image generated according to an embodiment of the present invention.

$s_{max}$: strongest signal due to the strongest incident flux on the different successive NDRO images obtained by non-destructive readout of the sensor of the image acquisition system.

$S_{sat}$: saturation signal of the sensor (imposed by the first saturated element in the detector: pixel, charge conversion and/or amplification chain, etc.)

$S_0$: signal corresponding to the weakest usable electronic signal excluding noise coming from the detector. This is typically the signal whose level corresponds to the readout noise of the detector (or more generally of the imaging system).

$S_{sel}$: signal selection threshold for selecting the value of the pixels for the HDR reconstruction according to a second embodiment of the invention described hereinafter.

$N_r$: readout noise of the detector, or more generally of the imaging system.

$N_T$: thermal noise associated with the thermal signal of the detector (accumulated during the exposure).

$N_p$: Photon noise associated with the light signal accumulated during the exposure. The noises $N_r$, $N_T$ and $N_p$ are generally expressed in electrons brought to the output of the detector, or in ADU with knowledge of the system Gain in e-/ADU (electrons per ADU).

$P_{i,j}^{NDRO_n}$: Value of the signal associated with the pixel with coordinates (i,j) in the matrix of the sensor, coming from the NDRO image with n rank $NDRO_n$, where $0 \leq n \leq n_{timeout}$.

$RSB_{i,j}^{NDRO_n}$: Signal-to-Noise Ratio of the pixel with coordinates (i,j) coming from the NDRO image with n rank $NDRO_n$, where $0 \leq n \leq n_{timeout}$.

It will be noted that the different signals $S_{max}$, $s_{max}$, $S_{min}$, $s_{min}$, $S_{sat}$, $S_{sel}$, $S_0$ are described above with no associated unit. Indeed, if they are seen after analog-digital conversion, they will be expressed in ADU units. Conversely, if they are considered before the analog-digital conversion step, they will then be expressed in the unit of the physical property (analog) that characterizes them: Volts or Amperes.

Based on these notations, the dynamic D of the HDR image to be generated can be expressed as the ratio:

$$D = \frac{S_{max}}{S_{min}} = \frac{s_{max}/t_{accu1}}{s_{min}/T_p} \quad \text{(Eq 1)}$$

with $$s_{min} = T_p \times F_{min,\lambda} \times Q_\lambda \quad \text{(Eq2)}$$

$$s_{max} = t_{accu1} \times F_{max,\lambda} \times Q_\lambda \quad \text{(Eq3)}$$

One can therefore deduce the relationship:

$$D = \frac{F_{max\lambda}}{F_{min\lambda}} \quad \text{(Eq 4)}$$

and:

$$t_{accu1} = t_{min} + (n_1 \times t_{NDRO}) n_1 \geq 0 \quad \text{(Eq5)}$$

$$T_p = t_{min}((n_1 + n_2) \times t_{NDRO}) n_2 \geq n_1 \quad \text{(Eq6)}$$

where the index $n_1$ designates the index, from among a series of NDRO images obtained by non-destructive readout of the image sensor, of the first NDRO image to be used to generate the high dynamic range image HDR, and where the index $n_2$ designates the number of NDRO images taken from the first useful image with index $n_1$, such that $n_1 + n_2$ is the index, from among the series of NDRO images obtained by non-destructive readout of the image sensor, of the last NDRO image to be used to generate the high dynamic range image HDR.

The dynamic of the image acquisition system (with the detector in the first instance) is finite, it is limited at the low values by the highest noise level ($S_0$) and at the high values by the saturation level of the system $S_{sat}$ (the first element of the chain that saturates). The incident luminous fluxes that can be rendered on a 'raw' (non-HDR) image are those which, integrated during an exposure time t, yield a signal Sig that responds to $S_0 < Sig < S_{sat}$. The luminous fluxes being set by the scene to be imaged and the diaphragm of the optical path that are, a priori, not changeable, the adjustable parameters are therefore the different exposure times with, in particular, $T_p$, which corresponds to the exposure time associated with the last NDRO image used to generate the HDR image, and therefore the exposure time of this HDR image, and $t_{accu1}$, which, as indicated above, corresponds to the exposure time associated with the first NDRO image used to generate the HDR image.

These two adjustable parameters are, however, adjustable within certain limits, namely:

$t_{accu1} \geq t_{min}$: indeed, the exposure time associated with the first NDRO image to be used to generate the HDR image cannot be less than the minimum accumulation time of the image acquisition system; and $$T_p \leq T_{timeout} \quad \text{(Eq7)}$$

Indeed, the exposure time associated with the HDR image is bounded by the maximum exposure time defined beforehand.

It will be noted that the times $t_{min}$ and $T_{timeout}$ are fixed for a sequence of HDR shots, but can be modified to be better suited to the brightness conditions of the scene to be imaged. Nevertheless, $T_{timeout}$ must be 'short' enough for the noise associated with the thermal signal accumulated during $T_{timeout}$ not to be greater than the minimum signal to be detected. The temperature, during operation, of the detector being known, the thermal signal (in electrons/second created, accumulated then read) is known, as is its associated noise. The thermal signal (also called thermal 'noise') as a function of the temperature, is a builder datum of the detector.

Furthermore, the inventors of the present patent application have established that certain additional constraints should be respected by the minimum accumulation time of the system $t_{min}$, in order to avoid any loss of information in a linear response system, so as not to depart from the linear operating range of the sensor.

Thus, in the limit case where $t_{accu1}=t_{min}$, and where the accumulation time associated with the $n^{th}$ NDRO image is $t_{accu\_n}=t_{accu1}((n-1) \times t_{NDRO})$, i.e., the accumulation times associated with the different successive NDRO images intersect by a pitch $t_{NDRO}$, an additional constraint must be respected between the accumulation time of the first and the second useful NDRO images, in the form:

$$\frac{t_{accu\_2}}{t_{accu1}} < \frac{S_{sat}}{S_0} \text{ or }$$

$$\frac{t_{min} + (t_{NDRO})}{t_{min}} < \frac{S_{sat}}{S_0} \quad \text{(Eq. 8)}$$

In other words, to avoid any loss of information, it is appropriate, for systems with linear response sensors, to meet the conditions of equation Eq. 8. Alternatively, it is possible to use systems with linear/logarithmic mixed response sensors, which lift the issue of relative accumulation time between the first and second useful NDRO images, $t_{accu1}$ and $t_{accu\_2}$, which makes it possible to reduce the minimum accumulation time of the acquisition system $t_{min}$ to the minimum physical time of the system clock (i.e., to one clock tick).

5.2 Description of One Embodiment

These principle having been recalled, we will now describe, in connection with FIG. 1, a flowchart of a method for generating a high dynamic range image HDR, according to one embodiment of the present invention.

Such a method can be implemented in any type of image acquisition system, whether it involves still or video images. Such a system is in particular described in more detail hereinafter in connection with FIGS. 2 and 3.

According to this embodiment, a real-time selection is done of the values of the pixels to be used for the reconstruction of the final HDR image with only the storage of the single image at any moment of the generation.

Indeed, from the first read NDRO image (readout done after the accumulation time $t_{min}$), it is necessary to determine the pixels, coming from this first NDRO image and the NDRO images that follow, that will be relevant for the HDR reconstruction. Indeed, a value of a pixel coming from the $n^{th}$ NDRO image, $P_{i,j}^{NDRO_n}$, will only be usable if at least $$S_0 < P_{i,j}^{NDRO_n} < S_{sat}$$

where $S_0$ is the signal corresponding to the weakest usable electronic signal coming from the detector (typically, the signal whose level corresponds to the readout noise of the detector or more generally of the imaging system), and where $S_{sat}$ is the saturation signal the sensor (imposed by the first saturated element in the detector: pixel, charge conversion and/or amplification chain, etc.). In this embodiment, one seeks to optimize the SNR (Signal-to-Noise Ratio) on a level set in advance in the shortest time, not exceeding a maximum exposure time ($T_{timeout}$) that is also set in advance.

$$RSB_{i,j}^{NDRO_n} = \frac{P_{i,j}^{NDRO_n}}{\sqrt{N_r^2 + N_T^2 + N_p^2}} \quad \text{(Eq. 9)}$$

with $$N_{tot} = \sqrt{N_r^2 + N_T^2 + N_p^2} \text{ or } RSB_{i,j}^{NDRO_n} = \frac{P_{i,j}^{NDRO_n}}{N_{tot}} \quad \text{(Eq. 10)}$$

The value of the noise associated with the value of a pixel evolves at the root of the value of the signal accumulated on the pixel. To maximize the signal-to-noise ratio $RSB_{i,j}$ of a pixel with coordinates (i,j), it is necessary to accumulate as much signal as possible to increase its value $P_{i,j}$, i.e., to maximize its exposure time: indeed, $P_{i,j}$ evolves as a function of exposure time and the noise also evolves, at the root of $P_{i,j}$, therefore much less quickly. In most cases, this function is linear (with a constant incident luminous flux during exposure). This allows the direct use of the NDRO images by simple weighting (Eq. 13, see below). In the case of a nonlinear behavior, it is necessary to obtain the response function of the detector (and/or of the imaging system) for each pixel, during the calibration of the detector and/or the associated imaging system. This response for each pixel will make it possible to weight the value of each pixel, and thus to fall back on the linear exploitation described in the equation (Eq. 13). The SNR is optimized at each NDRO and pixels are selected on this criterion. Thus, the final SNR will be optimized for each selected pixel in each respective NDRO and in particular for the weakest signals that have been selected and will have led to the last NDRO (as long as the desired SNR has been reached for the pixels with the weakest signals before the timeout $t_{out}$, also set in advance).

As illustrated in FIG. 1, during a prior step referenced 100, one determines the value of certain adjustable parameters of the system, which include:
- the minimum accumulation time of the acquisition system $t_{min}$;
- the maximum exposure time of the sensor $T_{timeout}$;
- the desired signal-to-noise ratio SNR for each of the pixels and above all for the pixels with the weakest signals, for the HDR image to be generated (see Eq. 10);
- the value of a single selection threshold $S_{sel}$, which is defined such that $S_{sel}<S_{sat}$ (and $S_{sel}>S_0$).

The value of these parameters is in particular established based on brightness conditions (luminous flux) of the scene to be imaged. Thus, the minimum accumulation time of the acquisition system $t_{min}$, which is set before the shot acquisition, can be optimized, before the acquisition, at the strong luminous flux of the scene. For an acquisition system with a linear response sensor, this minimum accumulation time $t_{min}$ must, however, respect the constraint of equation Eq. 8:

$$\frac{t_{min} + (t_{NDRO})}{t_{min}} < \frac{S_{sat}}{S_0},$$

in order to stay within the linear operating range of the sensor, and to avoid any loss of information. For an acquisition system with a linear/logarithmic mixed response sensor, it is possible to reduce the time $t_{min}$ if applicable to the minimum time of the system clock.

Likewise, the signal selection threshold $S_{sel}$ can be modified to best adapt to the illumination conditions of the scene, or to optimize and favor the exposure time $T_P$, or to optimize and favor the final SNR for the weakest signals, etc.

This prior step referenced 100 must be implemented upon initialization of the image acquisition system. It can be reiterated upon each new image acquisition for HDR reconstruction. Alternatively, the same parameters can be kept for several successive HDR image captures. It is also possible to consider that some of these parameters remain unchanged from one HDR shot acquisition to the next, while others are adapted upon each new shot acquisition.

During the step referenced 101, one begins a series of non-destructive readouts of the sensor, which each deliver a so-called NDRO image with index n, n being initialized at 0 (step referenced 102).

For each current NDRO image with index n, the value of the pixel $P_{i,j}^{NDRO_n}$ is selected to be used for the reconstruction of the final HDR image once:

$$P_{i,j}^{NDRO_n} \geq S_{sel} \quad \text{(Eq. 11)}$$

This comparison of the value of the pixels $P_{i,j}^{NDRO_n}$ of the current image $NDRO_n$ with the signal selection threshold $S_{sel}$ is done during a step referenced 103. When the condition is met, the selected pixel is stored (step referenced 104), in association with the exposure time of the image $NDRO_n$ from which it is extracted, denoted $t_{i,j}^{NDRO_n}$. It will then be used to generate the HDR image referenced 108.

The higher $S_{sel}$ is (while verifying $S_{sel} < S_{sat}$), the more pixels $P_{i,j}^{NDRO_n}$ there are whose value meets the condition of equation Eq. 11, in a time shorter than $T_{timeout}$, with a high SNR.

The first NDRO image in which at least one pixel satisfies the condition of equation Eq. 11 is the first image from the series of NDRO images that will be used for the reconstruction of the HDR image, referenced 108.

If no pixel of the current image $NDRO_n$ satisfies the condition of equation Eq. 11, one verifies, during a step referenced 105, whether the exposure time $t_{i,j}^{NDRO_n}$ associated with the current image $NDRO_n$ reaches the maximum exposure time determined during the preliminary step 100.

If this is not the case, the index of the current NDRO image is incremented during a step referenced 106 (n:=n+1), and the non-destructive readouts of the sensor continue.

If, however, the result of the comparison of the step referenced 105 is positive, this means that for some pixels of the NDRO image associated with the maximum exposure time, $P_{i,j}^{NDRO_n}$ remains below $S_{sel}$. In this case, the pixel, among the $n_2$ NDRO images taken, which would yield the best SNR, will be that of the last NDRO image taken, associated with the predefined maximum exposure time.

One then stores, during a step referenced 107, the values of the pixels of this last useful NDRO image, in association with the maximum exposure time that is associated with them, whose value remained below the selection threshold $S_{sel}$.

Indeed, while for at least some pixels of the sensor, the condition of equation Eq. 11 is not verified before the end of the exposure time $T_P$, it is then the last pixel value coming from the last NDRO image taken that will be kept, in association with its exposure time (here corresponding to $T_P$).

The non-destructive readout iterations of the sensor can be interrupted when all of the pixels of the sensor have reached a signal value greater than or equal to the signal selection threshold $S_{sel}$.

Each pixel selected for the reconstruction of the HDR image will therefore come from one of the NDRO images taken between $t_{min}$ and $T_P$ with $T_P \leq T_{timeout}$, it will be characterized by its value $P_{i,j}^{NDRO_n}$ and its exposure time $$t_{i,j}^{NDRO_n} = t_{min} + ((n-1) \times t_{NDRO}) \quad \text{(Eq. 12)}.$$

The generation of the HDR image, referenced 108, is done from values of the pixels stored during steps referenced 104 and 107, weighted by their respective exposure times:

$$P_{i,j}^{HDR} = \frac{P_{i,j}^{NDRO_n}}{t_{i,j}^{NDRO_n}} \quad \text{(Eq. 13)}$$

It will be noted that, in the case where the acquisition time $t_{min}$ does not comply with the constraint of equation Eq. 8, all of the pixels of the final HDR reconstructed image, whereof the value $$P_{i,j}^{HDR} = \frac{P_{i,j}^{NDRO_n}}{t_{i,j}^{NDRO_n}}$$

is such that $$\frac{S_0}{t_{min}} < P_{i,j}^{HDR} < \frac{S_{sat}}{t_{accu\_2}},$$

will not contain relevant information.

In one embodiment, an 'image' of the matrix of the detector is stored in a memory and is re-updated upon each new NDRO image taken. Each element of this memory area stores the value $P_{i,j}^{NDRO_n}$ (current during the last read NDRO image) weighted by its corresponding exposure time $t_{i,j}^{NDRO_n}$. For the pixels whose value has reached the selection threshold $S_{sel}$ in a preceding NDRO image, the elements of the memory zone are of course not re-updated, and remain frozen at the value stored during the step referenced 104.

Thus, during the first NDRO readout of the step referenced 101, the memory area representative of the detector matrix is initialized with the values of the pixels $P_{i,j}^{NDRO_n}$ of the first NDRO image with index n=0. Those of these pixels whose value is above the selection threshold of the signal $S_{sel}$ are stored permanently in the memory area, without being able to be updated further during the following NDRO readouts.

The reconstruction of the high dynamic range image HDR is therefore done gradually, over the course of the different non-destructive readouts of the sensor done during the exposure time $T_P$.

This embodiment, illustrated in FIG. 1, allows the real-time adaptation of the exposure times (always with the prerequisite of equation Eq. 7). This embodiment does not require determining the NDRO images at the moments $T_p$ and $t_{accu1}$, the HDR image building itself upon each new NDRO image, until the previously defined optimum. Furthermore, this method works optimally with one and only one 'image' of the matrix of the detector stored in memory. This matrix, in memory, is re-updated upon each new acquired NDRO image. Each element of this matrix stores a value of the pixel, whether it is current during the last read NDRO image or of the $n^{th}$ NDRO, and is weighted by its respective exposure time.

This method is therefore particularly advantageous in terms of required memory space, and necessary computing capacity to generate the HDR image. Unlike certain methods of the state of the art, it is not necessary to access several NDROs at once. As a result, during a real-time HDR generation, the number of NDROs is then not limited by the system.

It will also be noted that, in the case of a system with a linear/logarithmic mixed response sensor, there is cause to have a calibration of the logarithmic response and the linear/logarithmic transition area, in order to weight the value of each pixel, and thus to fall back on the linear exploitation described by equation Eq. 13. Furthermore, also in this case, the selection threshold for the pixels must be adapted to the operating zone of the sensor. Thus, for the first two NDRO images, the selection threshold $S_{sel}$ can use the logarithmic part of the operation of the sensor, while being such that $S_{sel} > S_{sat\_lin}$, where $S_{sat\_lin}$ is the maximum signal level at which the linear/logarithmic detector offers a linear response. Being in a logarithmic response, there is no longer a relevant maximum saturation limit at this time. Beyond the second NDRO image, all of the following NDRO images being read after an accumulation time regularly increasing by a pitch $t_{NDRO}$, one is in a linear operating range of the sensor. One then has $S_{sel} \leq S_{sat\_lin}$, where the value $S_{sat\_lin}$ becomes equivalent to the value $S_{sat}$ of the saturation signal of the sensor, mentioned previously in the present document.

5.3 Examples of HDR Image Generation Systems

We will now describe, in connection with FIGS. 2 and 3, two examples of hardware architecture of an HDR image generation system (200, 300) implementing the method described above in connection with FIG. 1.

The elements shared by FIGS. 2 and 3 bear the same numerical references, and are briefly described hereinafter.

Such a system for generating HDR images 200, 300 comprises the following elements, which are connected to one another by a data bus and addresses:
- a processing and digital control unit 201, 301, which can for example be a microprocessor, an FPGA (Field-Programmable Gate Array), a DSP (Digital Signal Processor), a GPU (Graphics Processing Unit);
- a memory 202, 302;
- a user interface, not shown, connected to the processor 201, 301 by an external digital link 205, 305 of the Ethernet, USB, Cam Link, etc. type;
- a digital processing module 203, 303, in particular comprising an image sensor 204, 304 comprising a plurality of pixels arranged in matrix form, and each associated with a photoelectric conversion element making it possible to convert received light into electric charges and to accumulate these electric charges for an exposure time to the light. This sensor is adapted to operate in a non-destructive readout mode.

Such a system 200, 300 also conventionally comprises a memory of the ROM (Read Only Memory) type that comprises at least one program and different parameters necessary for the execution of the method according to one embodiment of the invention. When it is powered on, the processor loads the program into a memory of the RAM (Random Access Memory) type and executes the corresponding instructions.

The system 200, 300 also comprises an electrical power source, not shown, for example in battery form, which in particular provides the different power signals 214, 314.

The user interface allows the user to choose the determined parameters during the step referenced 100 in FIG. 1. They supply a module 211, 311 ("User external Controls & Values interpreter"), in which they are stored, and which is adapted to provide them to the other elements of the system 200, 300. This module referenced 211, 311 in particular stores:
- the maximum exposure time of the sensor $T_{timeout}$;
- the saturation signal $S_{sat}$;
- the minimum signal $S_0$.

A processor 212, 312 is configured to automatically calculate the signal selection threshold $S_{sel}$, from the saturation signal $S_{sat}$, the minimum signal $S_0$, and information coming from the preceding HDR image acquisition, such that $S_0 < S_{sel} < S_{sat}$.

The maximum exposure time of the sensor $T_{timeout}$ is also sent to a clock generator 213, 313, intended to generate and control the different synchronous clock signals necessary for the operation of the analog processing module 203, 303.

The memory 202, 302 comprises several memory cells (i,j), which each contain the value of the pixel $P_{i,j}^{NDRO_n}$ selected during the step referenced 104 or 107 in FIG. 1. Each memory cell also stores the index n of the current NDRO image from which this pixel value is extracted. The exposure time associated with the pixel is $n*t_{NDRO}$.

Upon each non-destructive readout of the sensor 204, 304, the latter delivers an analog signal, representing the value of the electric charges accumulated by each of the pixels of the sensor.

As illustrated previously in connection with FIG. 1, the values of the pixels $P_{i,j}^{NDRO_n}$ are tested relative to the signal selection threshold $S_{sel}$ (Threshold Value) simply by level comparison (voltage level, for example).

In the example of FIG. 2, this comparison is done, very simply, in an analog manner, by using comparators 215. After amplification 216, the pixel values conveyed by the analog signal coming from the sensor 604 are compared to the signal selection threshold $S_{sel}$ (Threshold Value) and the saturation signal $S_{sat}$ (Saturation Value). After application and analog-digital conversion 217, the pixels whose value is above the selection threshold $S_{sel}$ must be stored, and are therefore transmitted by a bus to the memory 202.

Due to its simplicity, this analog preprocessing (for the adaptive aspect of this HDR reconstruction method by NDRO image) can be integrated directly, 'On Chip', within the sensor, for pixel 'clusters', or directly within each pixel in a 3D-CMOS structure, for example.

In the example of FIG. 3, on the contrary, this comparison is done in an offloaded manner within the digital processing unit 301, in a comparator module 315. Thus, the analog signal delivered by the sensor 304 is amplified and converted into a digital signal (module 317), before being supplied at the input of the comparator module 315, which compares the digital signal value associated with each pixel to the signal selection threshold $S_{sel}$ and to the saturation signal $S_{sat}$, and selects those which must be stored in the memory 302, so that they may be used to reconstruct the HDR image.

The invention claimed is:

1. A method for generating a high dynamic range image of a scene, from a plurality of images of said scene obtained by non-destructive readout of an image sensor, the plurality of images being non-destructive read out (NDRO) images, said sensor including a plurality of pixels arranged in matrix form, and each associated with a photoelectric conversion element enabling converting a received light into electric charges and accumulating the electric charges during an exposure time to the light, the method comprising:
   a first non-destructive reading out of said image sensor, delivering a first current NDRO image with index n=0, and storing of said first image, within a memory zone, in association with an exposure time associated with said first image;

for each pixel of said first image, comparing a signal value corresponding to said electric charges accumulated by said pixel with a signal selection threshold, and selecting said pixel when said signal value associated with said pixel is above said signal selection threshold;

at least one iteration of the following successive steps, for integer n, n varying from 1 to N:

non-destructively reading out said image sensor, delivering a current NDRO image with index n, updating said memory zone by storing, for each pixel of said current NDRO image with index n not previously selected in an NDRO image preceding said current NDRO image, a signal value associated with said pixel, in combination with an exposure time associated with said current NDRO image with index n, and for each pixel of said current NDRO image with index n, comparing a signal value corresponding to said electric charges accumulated by said pixel with said signal selection threshold, and selecting said pixel when said signal value associated with said pixel is above said signal selection threshold; and generating said high dynamic range image from the stored signal values, weighted by said associated exposure times of said signal values associated with said selected pixels and of said exposure times stored in association.

2. The method for generating a high dynamic range image according to claim 1, wherein the method implements a storage of a single image at a given moment.

3. The method for generating a high dynamic range image according to claim 1, further comprising determining a desired quality criterion for said high dynamic range image and a maximum exposure time for said sensor.

4. The method for generating a high dynamic range image according to claim 3, wherein said desired quality criterion is a signal-to-noise ratio of the pixels of said high dynamic range image.

5. The method for generating a high dynamic range image according to claim 3, wherein said NDRO image with index N is:

the first of said successive NDRO images in which all of the pixels are associated with a signal value greater than or equal to said signal selection threshold, or an NDRO image, associated with said maximum exposure time of said sensor, when the NDRO image contains at least one pixel associated with a signal value below said signal selection threshold.

6. The method for generating a high dynamic range image according to claim 1, wherein said generating said high dynamic range image comprises calculating a signal value associated with each pixel of said high dynamic range image by evaluated weight, based on the response from the sensor, of said signal value stored in said memory area for each of said pixels by said associated exposure time.

7. The method for generating a high dynamic range image according to claim 1, further comprising determining a minimum electric charge accumulation time (tmin) on the image sensor before the first non-destructive readout of said image sensor, and wherein said minimum accumulation time tmin satisfies the condition:

$$\frac{t_{min} + (t_{NDRO})}{t_{min}} < \frac{S_{sat}}{S_0}$$

where:

$t_{NDRO}$ is a time between two of said successive iterations of non-destructive readout of said image sensor, $S_{sat}$ is a saturation signal of said image sensor, and $S_0$ is the weakest usable electronic signal, except noise, coming from said image sensor.

8. A non-transitory computer program product on a recording medium, comprising program code instructions for carrying out the method according to claim 1, when it is executed by a processor.

9. A non-transitory recording medium on which a computer program is recorded comprising program code instructions for carrying out steps of the method for generating a high dynamic range image according to claim 1, when executed by a processor.

10. A system for generating a high dynamic range image of a scene, from a plurality of images of said scene obtained by non-destructive readout of an image sensor, the plurality of images being non-destructive read out (NDRO) images, said sensor including a plurality of pixels arranged in matrix form, and each associated with a photoelectric conversion element enabling converting a received light into electric charges and to accumulate the electric charges during an exposure time to the light, the system comprising:

a computing unit configured to execute the method for generating a high dynamic range image according to claim 1.

11. A system for generating a high dynamic range image of the scene, from a plurality of images of said scene obtained by non-destructive readout of an image sensor, the plurality of images being non-destructive read out (NDRO) images, said system comprising:

a sensor comprising a plurality of pixels arranged in matrix form, and each associated with a photoelectric conversion element enabling to convert a received light into electric charges and to accumulate the electric charges during an exposure time to the light, said sensor being adapted to operate in a non-destructive readout mode;

one or more processors configured to compare, for each pixel of an NDRO image, among a plurality of successive NDRO images delivered by said sensor, a signal value corresponding to said electric charges accumulated by said pixel to a signal selection threshold, and to select said pixel when said signal value associated with said pixel is above said signal selection threshold and when said pixel has not been previously selected from a preceding NDRO image from said plurality of NDRO images;

and a memory configured to store signal values associated with said selected pixels of said successive NDRO images in association with exposure times associated with said NDRO images, wherein the one or more processors is configured to generate said high dynamic range image from said signal values associated with said selected pixels and said exposure times stored in association.

12. The system for generating a high dynamic range image of a scene according to claim 11, further comprising an interface module for entry by a user of a desired quality criterion for said high dynamic range image and of a maximum exposure time of said sensor.

13. The method for generating a high dynamic range image according to claim 2, further comprising determining a desired quality criterion for said high dynamic range image and a maximum exposure time for said sensor.

14. The method for generating a high dynamic range image according to claim 4, wherein said NDRO image with index N is:
the first of said successive NDRO images in which all of the pixels are associated with a signal value greater than or equal to said signal selection threshold, or
an NDRO image, associated with said maximum exposure time of said sensor, when the NDRO image contains at least one pixel associated with a signal value below said signal selection threshold.

15. The method for generating a high dynamic range image according to claim 2, wherein said generating said high dynamic range image comprises calculating a signal value associated with each pixel of said high dynamic range image by evaluated weight, based on the response from the sensor, of said signal value stored in said memory area for each of said pixels by said associated exposure time.

16. The method for generating a high dynamic range image according to claim 3, wherein said generating said high dynamic range image comprises calculating a signal value associated with each pixel of said high dynamic range image by evaluated weight, based on the response from the sensor, of said signal value stored in said memory area for each of said pixels by said associated exposure time.

17. The method for generating a high dynamic range image according to claim 4, wherein said generating said high dynamic range image comprises calculating a signal value associated with each pixel of said high dynamic range image by evaluated weight, based on the response from the sensor, of said signal value stored in said memory area for each of said pixels by said associated exposure time.

18. The method for generating a high dynamic range image according to claim 5, wherein said generating said high dynamic range image comprises calculating a signal value associated with each pixel of said high dynamic range image by evaluated weight, based on the response from the sensor, of said signal value stored in said memory area for each of said pixels by said associated exposure time.

19. The method for generating a high dynamic range image according to claim 2, further comprising determining a minimum electric charge accumulation time (tmin) on the image sensor before the first non-destructive readout of said image sensor, and
wherein said minimum accumulation time tmin satisfies the condition:

$$\frac{t_{min} + (t_{NDRO})}{t_{min}} < \frac{S_{sat}}{S_0}$$

where:
$t_{NDRO}$ is a time between two of said successive iterations of non-destructive readout of said image sensor,
$S_{sat}$ is a saturation signal of said image sensor, and
$S_0$ is the weakest usable electronic signal, except noise, coming from said image sensor.

20. The method for generating a high dynamic range image according to claim 3, further comprising determining a minimum electric charge accumulation time (tmin) on the image sensor before the first non-destructive readout of said image sensor, and
wherein said minimum accumulation time tmin satisfies the condition:

$$\frac{t_{min} + (t_{NDRO})}{t_{min}} < \frac{S_{sat}}{S_0}$$

where:
$t_{NDRO}$ is a time between two of said successive iterations of non-destructive readout of said image sensor,
$S_{sat}$ is a saturation signal of said image sensor, and
$S_0$ is the weakest usable electronic signal, except noise, coming from said image sensor.

* * * * *